(12) United States Patent
Li et al.

(10) Patent No.: US 11,706,893 B2
(45) Date of Patent: Jul. 18, 2023

(54) ROTATING ASSEMBLY, HANDLE LOCKING DEVICES, AND CHASSIS

(71) Applicant: Fulian Precision Electronics (Tianjin) Co., LTD., Tianjin (CN)

(72) Inventors: Han-Yu Li, New Taipei (TW);
Wen-Hu Lu, Tianjin (CN);
Ming-Liang Zhang, Tianjin (CN);
Li-Yi Yin, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/837,266

(22) Filed: Jun. 10, 2022

(65) Prior Publication Data
US 2023/0029476 A1    Feb. 2, 2023

(30) Foreign Application Priority Data

Jul. 27, 2021 (CN) .......................... 202110851276.0

(51) Int. Cl.
*H05K 7/14* (2006.01)
*F16M 13/02* (2006.01)

(52) U.S. Cl.
CPC ......... *H05K 7/1489* (2013.01); *F16M 13/022* (2013.01)

(58) Field of Classification Search
CPC ..... H05K 7/1489; F16M 13/022; G06F 1/187
USPC .................. 248/220.21, 560; 361/679.39
See application file for complete search history.

(56) References Cited

U.S. PATENT DOCUMENTS

| 6,181,549 | B1 * | 1/2001 | Mills ............... | H05K 7/1489 292/228 |
| 8,517,481 | B2 * | 8/2013 | Li ................... | H05K 5/0226 16/335 |
| 8,596,472 | B2 * | 12/2013 | Yin .................. | H05K 7/1489 211/26 |
| 8,614,894 | B2 * | 12/2013 | Zhang ............... | H05K 7/1489 361/728 |
| 8,854,823 | B2 * | 10/2014 | Wallace ............. | G06F 1/187 361/679.37 |
| 2021/0092861 | A1 * | 3/2021 | Yu .................. | H05K 7/1489 |

* cited by examiner

*Primary Examiner* — Todd M Epps
(74) *Attorney, Agent, or Firm* — ScienBiziP, P.C.

(57) ABSTRACT

A rotating assembly includes a first handle; the first handle includes a connecting part. The connecting part has first and second extensions and the connecting part is rotatably connected to a box holding one or more devices. The first and second extensions are arranged on opposite sides of the connecting part, the first extension can rotate with the connecting part until it rests on a base, on which base the box is rotatably arranged. The first extension and the second extension extend to both sides of the connecting part to lessen the force required for driving the box to rotate.

20 Claims, 5 Drawing Sheets

ROTATING ASSEMBLY, HANDLE LOCKING DEVICES, AND CHASSIS

FIELD

The subject matter herein generally relates to server construction, using rotating assembly, handle locking devices, and chassis.

BACKGROUND

The chassis of a server holds a large number of devices or item units. When the item unit needs to be replaced, the item unit must be unfastened and manipulated out of the server. a labor-saving structure would be an improvement.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
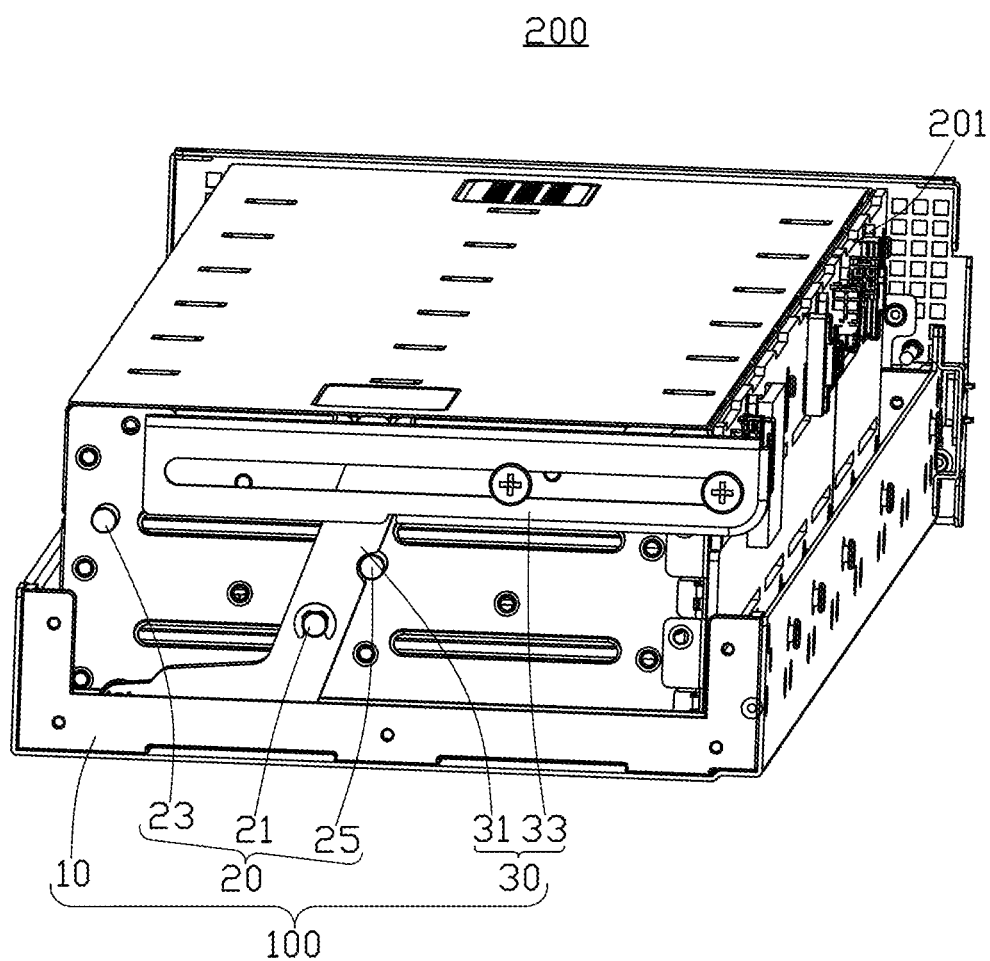
FIG. 1 is an isometric, assembled view of a chassis provided by the embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
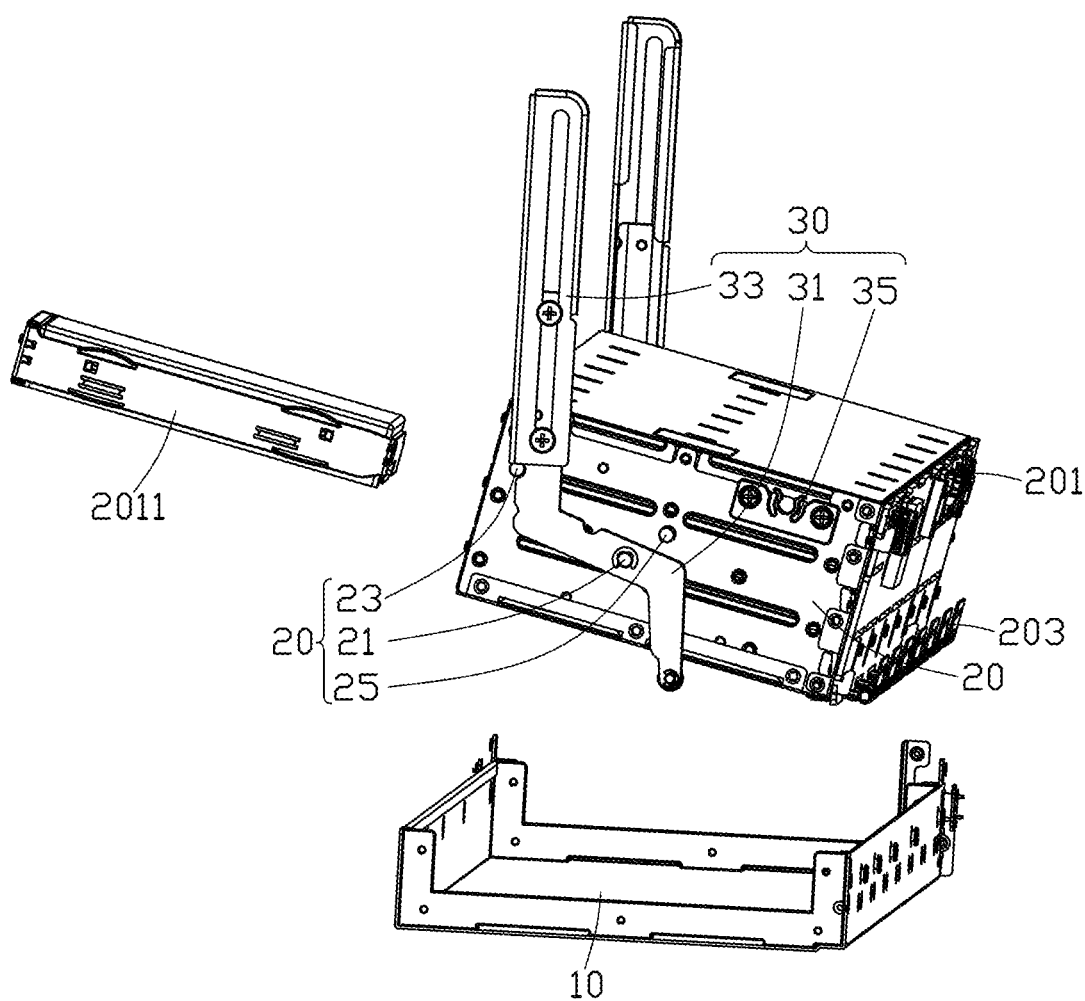
FIG. 2 is an isometric, exploded view of the chassis shown in FIG. 1, showing a handle locking device.

As shown in FIG. 1 and FIG. 2, an embodiment of the present application provides a chassis 200. The chassis 200 includes an item group 201 and a handle locking device 100. The handle locking device 100 includes a base 10, a box 20, and a rotating assembly 30. The item group 201 includes a plurality of item units 2011. For example, the item group 201 can be a hard disk assembly, and the item units 2011 can be a hard disk. The item units 2011 are arranged and stored in the box 20. The box 20 is rotatably connected to the base 10. The rotating assembly 30 allows the box 20 to rotate to a predetermined angle relative to the base 10, enabling the item unit 2011 to be easily taken out from the box 20. For example, the predetermined angle may be an acute angle less than 90°. For example, the chassis 200 may be a chassis of a server or a storage device.

The rotating assembly 30 includes a first handle 31. The first handle 31 includes a connecting part 311, a first extension 313, and a second extension 315. The connecting part 311 is rotatably connected to the box 20. In an embodiment, the box 20 is provided with a rotating shaft 21, and the connecting part 311 is rotatably connected to the rotating shaft 21.

It can be understood that, in other embodiments, the rotating shaft 21 may also be connected to the connecting part 311, the rotating shaft 21 is rotatably connected with the box 20.

It can be understood that, in another embodiment, the rotating shaft 21 and the connecting part 311 are integrally formed, or the rotating shaft 21 may be integrated with the box 20.

A direction of rotation of the connecting part 311 around the rotating shaft 21 is opposite to a direction of rotation of the box 20 relative to the base 10. One end of the first extension 313 is connected to the connecting part 311, and another end of the first extension 313 extends toward one side of the connecting part 311 until the first extension 313 is resting on the base 10.

One end of the second extension 315 is connected to the connecting part 311, and another end of the second extension 315 extends to one side of the connecting part 311 away from the first extension 313.

The first handle 31 is rotatable around the rotating shaft 21, and the box 20 rotates relative to the base 10 by the predetermined angle through the principle of leverage. The end of the second extension 315 away from the connecting part 311 is a power point; the end of the first extension 313 away from the connecting part 311 is in contact with the base 10, and the contact point is a fulcrum. The connecting part 311 is rotatably connected to the rotating shaft 21, and gravity acting on the box 20 and the structure on it bears against the connection between the connecting part 311 and the rotating shaft 21 as a resistance point. The first extension 313 and the second extension 315 extend to both sides of the connecting part 311, and the distance between the power point and the fulcrum is greater than the distance between the resistance point and the fulcrum.

The rotating assembly 30 also includes a second handle 33. The second handle 33 is slidably positioned on the second extension 315 and is moveable to the outer end of the second extension 315 away from the connecting part 311. The second handle 33 slides along the second extension 315 to the outer end of the second extension 315 facing away from the connecting part 311. The second handle 33 is rotatable, so that the first handle 31 is rotated around the rotating shaft 21, and the box 20 is rotated relative to the base 10 by the predetermined angle. The end of the second handle 33 away from the connecting part 311 is the power point, and the second handle 33 increases the distance between the power point and the fulcrum, thus less force is required for driving the box 20 to rotate. When rotation is not required, the second handle 33 is movable toward the connecting part 311 along the second extension 315. The size of the rotating assembly 30 can thus be reduced, and the requirements of higher space utilization of chassis 200 can be satisfied.

It can be understood that, in other possible embodiments, the box 20 can also store other items other than the item unit 2011. The handle locking device 100 can also be applied to other devices and equipment that need rotation of the box 20 to pick and place items stored in the box 20.

In an embodiment, the box 20 is rotatably connected to the base 10 through the hinge 203, but it is not limited to this. One end of the bottom wall of the box 20 is rotatably connected to the bottom wall of the base 10, and another end of the bottom wall of the box 20 can be driven from the base 10 by the rotating assembly 30. It can be understood that, in other embodiments, the box 20 may also be connected to the base 10 through other rotatable structures.

In an embodiment, when there is no relative rotation between the box 20 and the base 10, the bottom of the box 20 contacts the base 10, and the base 10 supports the box 20. It can be understood that in other embodiments, the only point of contact of the box 20 is with the base 10, there are no other points or areas of contact. The box 20 is rotatably connected to the base 10 and the first handle 31, and the first handle 31 abuts the base 10 so that the first handle 31 and the base 10 support the box 20 together.

The box 20 is at a first position when the box 20 is not rotated relative to the base 10 and is at a second position when the box 20 rotates to the predetermined angle relative to the base 10.

Figure 3:
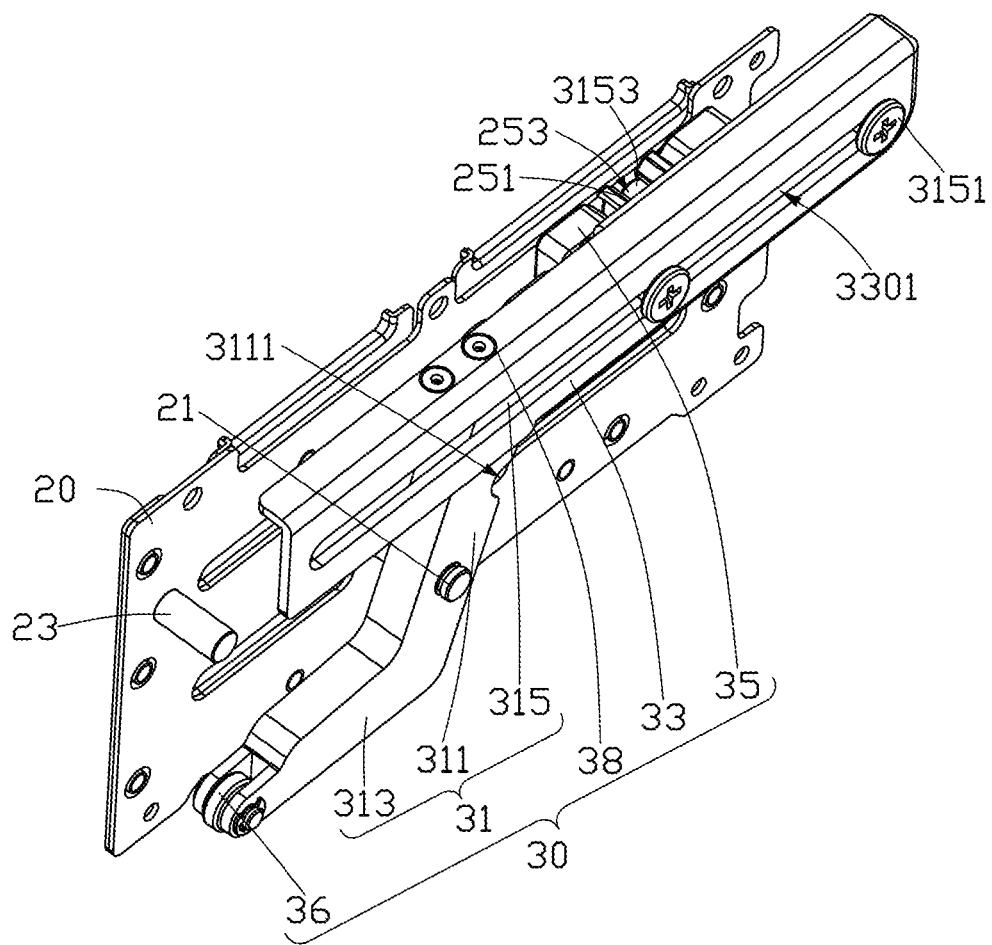
FIG. 3 is an isometric, assembled view of a rotating assembly and a box in the chassis shown in FIG. 1.
Figure 4:
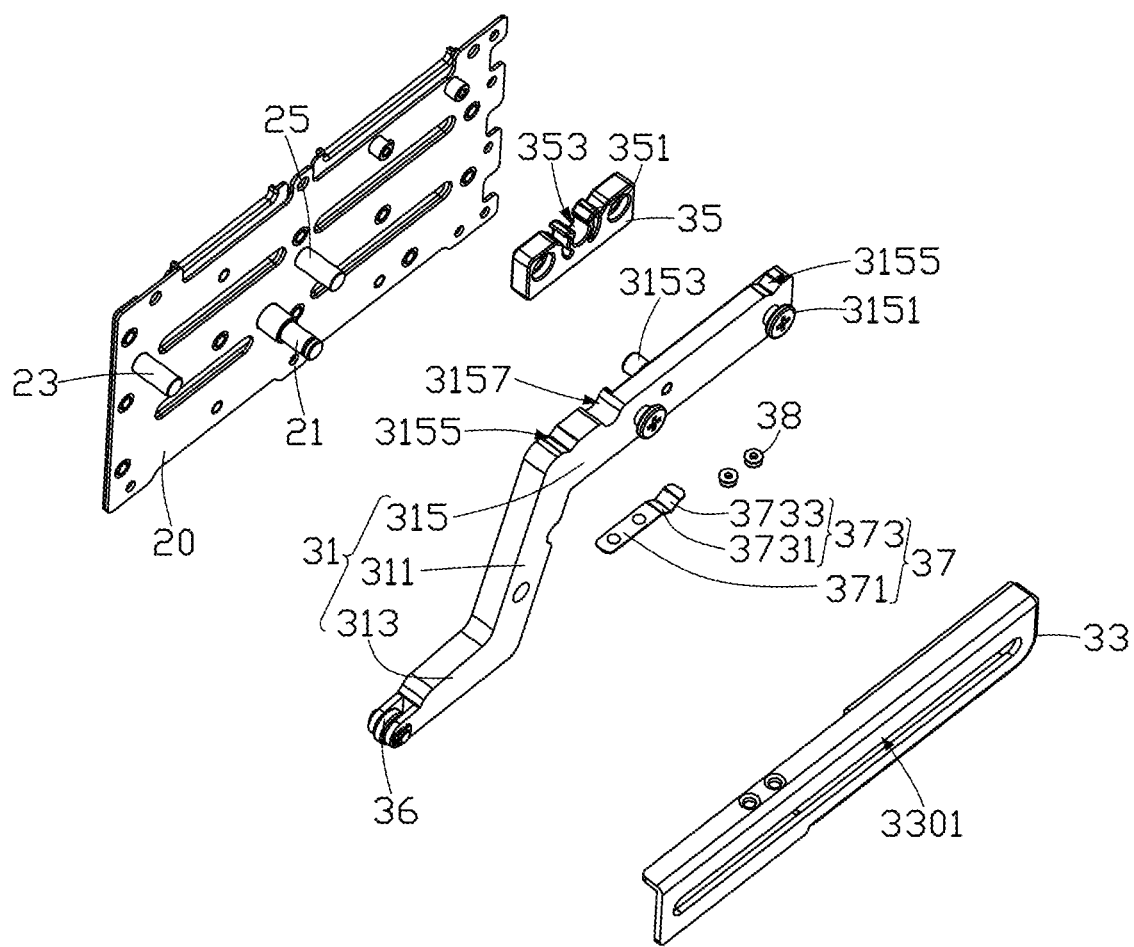
FIG. 4 is an isometric, exploded view of the rotating assembly shown in FIG. 3.
Figure 5:
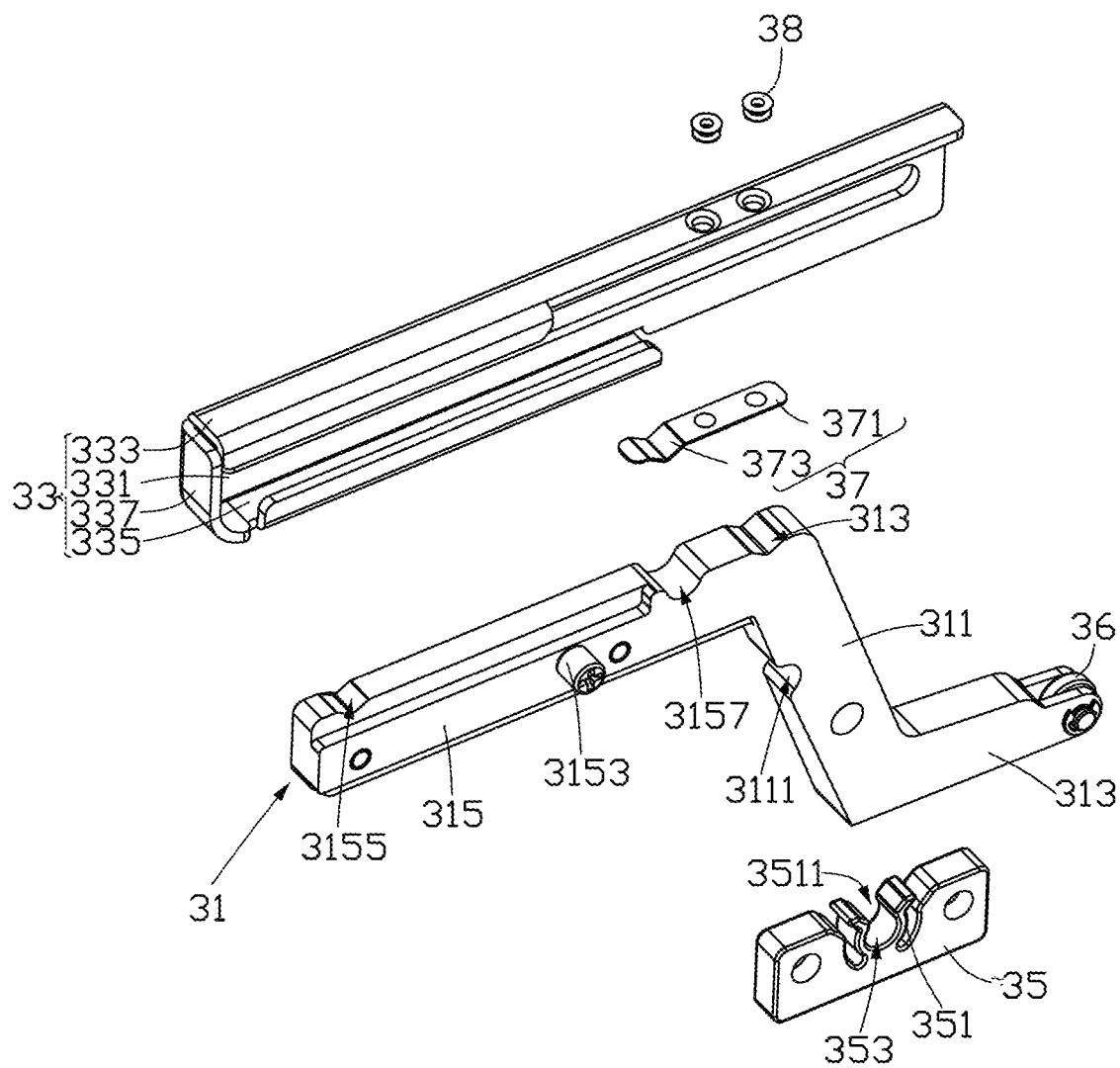
FIG. 5 is an isometric, exploded view of the handle locking device shown in FIG. 4.

As shown in FIG. 3, FIG. 4, and FIG. 5, the rotating assembly 30 further includes a stopper 35. The first handle 31 is connected to the box 20 through the stopper 35. The stopper 35 is set on the box 20. The stopper 35 is provided with a clamping part 351. The clamping part 351 is elastically deformable. A third slot 353 is defined in the clamping part 351. The first handle 31 is provided with a clamping shaft 3153. When the box 20 is at the first position, the clamping shaft 3153 is clamped in the third slot 353. An opening 3511 is defined in the clamping part 351. As the clamping shaft 3153 enters the third slot 353, the clamping part 351 elastically deforms, and the opening 3511 allows the clamping part 351 to enter the third slot 353. After the entire clamping shaft 3153 has entered the third slot 353, the clamping part 351 restores and returns to original shape, and the opening 3511 becomes smaller to stop the clamping shaft 3153. The clamping shaft 3153 will remain stably clamped in the third slot 353 without external force.

It can be understood that in other embodiments, the clamping part 351 of the stopper 35 can also be other elastically deformable structures as long as the third slot 353 is defined in the clamping part 35, and the clamping shaft 3153 can be clamped in place or out of place by external force. When the box 20 needs to be rotated, a small force is applied to the clamping shaft 3153 to pull the clamping shaft 3153 out of the third slot 353. Force applied to the second handle 33 rotates the first handle 31 around the rotating shaft 21, the end of the first extension 313 away from the connecting part 311 moves relative to the base 10, and the box 20 is rotated to the second position relative to the base 10.

In an embodiment, the clamping shaft 3153 is positioned on the second extension 315. The clamping shaft 3153 and the stopper 35 are close to the power point, and force applied at the power point disengages the clamping shaft 3153 from the third slot 353 of the stopper 35, and the first handle 31 continues to rotate the box 20.

It can be understood that, in other embodiments, the clamping shaft 3153 can also be positioned on the connecting part 311 or on the first extension 313, and the position of the stopper 35 changes accordingly to match the clamping shaft 3153.

It can be understood that, in other embodiments, the clamping shaft 3153 can also be arranged on the box 20, and the stopper 35 can be arranged on the first handle 31, and both the clamping shaft 3153 and the stopper 35 have snap-fit connections.

In an embodiment, the first handle 31 further includes a roller 36. The roller 36 is at the end of the first extension 313 away from the connecting part 311. The roller 36 is rotatably connected to the first extension 313. The roller 36 abuts the base 10. The first handle 31 rolls on the base 10, reducing friction between the first handle 31 and the base 10, and allowing less external force to be applied to the second handle 33 to drive the box 20 to rotate.

It can be understood that in other embodiments, the roller 36 may be omitted. A side of the first extension 313 away from the connecting part 311 can also be slidable on the bottom wall of the base 10.

In an embodiment, a extension direction of the first extension 313 is parallel to that of the second extension 315. A angle between the connecting part 311 and the second extension 315 is obtuse. A angle between the connecting part 311 and the first extension 313 is obtuse. When the box 20 does not need to be rotated, the first extension 313 and the second extension 315 are parallel to the bottom wall of the base 10, reducing the size of the rotating assembly 30 perpendicular to the bottom wall of the base 10.

It can be understood that, in other embodiments, the angle between the first extension 313 and the connecting part 311 may also be different from the angle between the second extension 315 and the connection part 311. The first extension 313 and the second extension 315 extend to both sides of the connecting part 311, and the distance between the power point and the fulcrum can be increased.

Whilst it is slidably connected to the first handle 31, the second handle 33 does not detach from the first handle 31. A chute 3301 is defined in the second handle 33, the second extension 315 is provided with a protrusion 3151. The protrusion 3151 is slidably arranged in the chute 3301 and prevents detachment of the second handle 33.

The second handle 33 wraps part of the first handle 31. The second handle 33 includes a subject 331, a first sliding part 333, and a second sliding part 335. The subject 331 is on the side of the first handle 31 away from the box 20. The first sliding part 333 and the second sliding part 335 are on opposite sides of the subject 331, both are bent and extended to the side of the subject 331 away from the first handle 31. When the second handle 33 is rotated, both sides of the second handle 33 along the rotating direction cover the first handle 31, which increases the strength of the second handle 33 and avoids local stress on the groove walls of the protrusion 3151 and the chute 3301.

The sides of the second handle 33 along the rotating direction cover the first handle 31, which avoids separation of the first handle 31 from the second handle 33.

It can be understood that, in other embodiments, the first sliding part 333 and the second sliding part 335 may be omitted.

One end of the protrusion 3151 away from the second extension 315 is provided with a stop 3152. The stop 3152 resists against the side of the second handle 33 away from the second extension 315, thereby preventing the first handle 31 and the second handle 33 from separating.

It can be understood that, in other embodiments, the stop 3152 may be omitted.

The second handle 33 also includes a limit part 337. The limit part 337 is set at one end of the subject 331 between the first sliding part 333 and the second sliding part 335. The limit part 337 resists against the end of the second extension 315 away from the connecting part 311.

It can be understood that, in other embodiments, the limit part 337 may be omitted.

There is a fixed sliding distance of the second handle 33 relative to the first handle 31. When the box 20 is in the first or second position the second handle 33 is stationary relative to the first handle 31, which is convenient to operate the second handle 33. The rotating assembly 30 also includes a positioning piece 37. The positioning piece 37 includes a body part 371 and a positioning part 373. The positioning part 373 is set on the body part 371 through a fastener 38. The body part 371 is set on the second handle 33. Two positioning slots 3155 are defined at intervals in the second extension 315. The body part 371 can be elastically deformed, so that the positioning part 373 slides along the second extension 315 and can be snap-fitted into the two positioning slots 3155.

The positioning piece 37 is generally an elastic sheet-like structure, and the positioning part 373 is formed by bending a part of the body part 371. The positioning part 373 includes a first part 3731 and a second part 3733. The first part 3731 and the second part 3733 are connected. The first part 3731 is set in the body part 371. The first part 3731 and the second part 3733 are arranged in sequence along the direction of the body part 371 toward the first part 3731. The first part 3731 and the second part 3733 intersect in a V-shape, and the positioning slot 3155 is a V-shaped slot. The first part 3731 and the second part 3733 provide guidance for the second handle 33 to move in opposite directions relative to the first handle 31.

It can be understood that, in other embodiments, the positioning part 373 may also be in other shapes. For example, in other embodiments, the positioning part 373 can also be a columnar structure made of a soft rubber material bonded to the body part 371. The body part 371 is elastically deformed, and the positioning part 373 can be snap-fitted into the positioning slot 3155.

The box 20 is provided with a first column 23. The axis of rotation of the box 20 relative to the base 10 and the first column 23 are located on opposite sides of the first handle 31. A first slot 3157 is defined in the second extension 315 on the side facing away from the first extension 313. The first column 23 is snap-fitted into the first slot 3157 to support the second extension 315. The angle between the box 20 and the base 10 is kept at the predetermined angle, that is, the box 20 remains in the second position without external force, which is convenient for picking and placing items in the box 20.

The second column 25 shares the force exerted on the stopper 35 by the first handle 31 and the second handle 33. The axis of rotation of the box 20 relative to the base 10 and the second column 25 is on one side of the first handle 31. A second slot 3111 is defined in the connecting part 311. When the box 20 is not rotated relative to the base 10, that is, when the box 20 is in the first position, the second column 25 can be snap-fitted into the second slot 3111 to support and fix the first handle 31 in place. It can be understood that, in other embodiments, the second slot 3111 may also be defined in the second extension 315.

In the above chassis 200 and the handle locking device 100, the box 20 is rotated relative to the base 10 by the predetermined angle through the lever principle. The end of the second extension 315 away from the connecting part 311 is the power point; the end of the first extension 313 away from the connecting part 311 is in contact with the base 10, and the contact point is the fulcrum; the connection between the connecting part 311 and the rotating shaft 21 is the resistance point. The first extension 313 and the second extension 315 extend to both sides of the connecting part 311, and the distance between the power point and the fulcrum is greater than the distance between the resistance point and the fulcrum to lessen the force required for driving the box 20 to rotate.

The second handle 33 can slide to the outside of the second extension 315, which further increases the distance and thus leverage between the power point and the fulcrum in rotating the box 20. When rotation of the box 20 is not required, the second handle 33 can move in the direction of the second extension 315 toward the connecting part 311, reducing the size of the rotating assembly 30 and better meeting space utilization of the chassis 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:
1. A handle locking device comprising:
a base;
a box rotatably connected to the base; and
a rotating assembly, wherein:
the rotating assembly comprises a first handle;
the first handle comprises:
  a connecting part rotatably connected to the box, and a direction of rotation of the connecting part relative to the box is opposite to a direction of rotation of the box relative to the base;
  a first extension, one end of the first extension is arranged on the connecting part, and another end of the first extension extends to one side of the connecting part, and the first extension are rotatable with the connecting part until the first extension rests on the base; and
  a second extension, one end of the second extension is connected to the connecting part, and another end of the second extension extends toward a side of the connecting part that is away from the first extension.

2. The device of claim 1, wherein:
the rotating assembly further comprises:
a second handle slidably positioned on the second extension;
the second handle is movable to an outer end of the second extension away from the connecting part.

3. The device of claim 2, wherein:
the rotating assembly further comprises:
a positioning piece comprising:
  a body part set on the second handle; and
  a positioning part set on the body part;
two positioning slots are defined at intervals in the second extension;
the body part is elastically deformable, and the positioning part is slidable on the second extension and configured to snap-fit into the two positioning slots.

4. The device of claim 3, wherein:
the positioning part comprises:
a first part set on the body part,
a second part connected to the first part, and arranged in sequence in a direction of the body part toward the first part;
the first part and the second part intersect in a V-shape, and the positioning slot is a V-shaped slot.

5. The device of claim 2, wherein:
a chute is defined in the second handle, and the second extension is provided with a protrusion, and the protrusion is slidably arranged in the chute.

6. The device of claim 5, wherein:
one end of the protrusion away from the second extension is provided with a stop, the stop resists against the side of the second handle away from the second extension, thereby preventing the first handle and the second handle from separating.

7. The device of claim 2, wherein:
the second handle comprises:
a subject located on the side of the first handle away from the box;
a first sliding part; and
a second sliding part;
the first sliding part and the second sliding part are on opposite sides of the subject, and both are bent and extended to a side of the subject away from the first handle.

8. The device of claim 7, wherein:
the second handle further comprises:
a limit part set at one end of the subject between the first sliding part and the second sliding part, the limit part resisting against the end of the second extension away from the connecting part.

9. The device of claim 1, wherein:
the rotating assembly further comprises:
a stopper arranged on the box and connected to the first handle.

10. The device of claim 9, wherein:
the stopper is provided with an elastically deformable clamping part, the clamping part is set on the box;
a third slot is defined in the clamping part, and the first handle is provided with a clamping shaft;
when the box does not rotate relative to the base, the clamping shaft can be clamped in the third slot.

11. The device of claim 10, wherein:
the clamping shaft is positioned on the second extension.

12. The device of claim 1, wherein:
the box is provided with a first column, the first column and an axis of rotation of the box relative to the base are located on opposite sides of the first handle,
a first slot is defined in the second extension;
the first column is snap-fitted into the first slot to support the second extension, so that the box and the base are kept at a predetermined angle.

13. The device of claim 1, wherein:
the box is provided with a second column, the second column and an axis of rotation of the box relative to the base are located on the one side of the first handle;
a second slot is defined in the second extension or the connecting part;
the second column is snap-fitted into the second slot to support and fix the first handle in place.

14. The device of claim 1, wherein:
the first handle further comprises:
a roller at an end of the first extension away from the connecting part.

15. The device of claim 1, wherein:
the extension direction of the first extension is parallel to the extension direction of the second extension, and a angle between the connecting part and the second extension is obtuse, and a angle between the connecting part and the first extension is obtuse.

16. A chassis comprising:
an item group; and
a handle locking device; wherein:
the handle locking device comprises:
  a base;
  a box rotatably connected to the base; and
  a rotating assembly;
the rotating assembly comprises a first handle;
the first handle comprises:
  a connecting part rotatably connected to the box, and a direction of rotation of the connecting part relative to the box is opposite to a direction of rotation of the box relative to the base;
  a first extension, one end of the first extension is arranged on the connecting part, and another end of the first extension extends to one side of the connecting part, and the first extension are rotatable with the connecting part until the first extension rests on the base; and
  a second extension, one end of the second extension is connected to the connecting part, and another end of the second extension extends toward a side of the connecting part that is away from the first extension,
the item group is arranged in the box.

17. A rotating assembly, wherein:
the rotating assembly comprises:
a rotating assembly comprises a first handle;
a first handle comprising:
  a connecting part rotatably connected to a box,
  a first extension, one end of the first extension is arranged on the connecting part, and another end of the first extension extends to one side of the connecting part, and the first extension can rotate with the connecting part until it rests on a base, and the box is rotatably arranged on the base; and
  a second extension, one end of the second extension is connected to the connecting part, and another end of the second extension extends toward the side of the connecting part that is away from the first extension.

18. The rotating assembly of claim 17, wherein:
the rotating assembly further comprises:
a second handle slidably positioned on the second extension;
the second handle is movable to an outer end of the second extension away from the connecting part.

19. The rotating assembly of claim 17, wherein:
the rotating assembly further comprises:
a positioning piece, comprising:
 a body part set on the second handle; and
 a positioning part set on the body part;
two positioning slots are defined at intervals in the second extension;
the body part is elastically deformable, and the positioning part slides along the second extension and is configured to be snap-fit into the two positioning slots.

20. The rotating assembly of claim 17, wherein:
the first handle also comprises:
 a roller at an end of the first extension away from the connecting part.

* * * * *